(12) United States Patent
Hane et al.

(10) Patent No.: US 11,725,276 B2
(45) Date of Patent: Aug. 15, 2023

(54) PLASMA PURGE METHOD

(71) Applicant: Tokyo Electron Limited, Tokyo (JP)

(72) Inventors: Hideomi Hane, Yamanashi (JP); Hyunjoon Bang, Yamanashi (JP); Noriaki Fukiage, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/447,721

(22) Filed: Sep. 15, 2021

(65) Prior Publication Data

US 2022/0081764 A1 Mar. 17, 2022

(30) Foreign Application Priority Data

Sep. 16, 2020 (JP) ................... 2020-155806

(51) Int. Cl.
| | | |
|---|---|---|
| *C23C 16/44* | (2006.01) | |
| *H01L 21/02* | (2006.01) | |
| *H01L 21/67* | (2006.01) | |
| *C23C 16/02* | (2006.01) | |
| *H01L 21/324* | (2006.01) | |

(52) U.S. Cl.
CPC ...... *C23C 16/4404* (2013.01); *C23C 16/0227* (2013.01); *H01L 21/02046* (2013.01); *H01L 21/02263* (2013.01); *H01L 21/324* (2013.01); *H01L 21/67248* (2013.01)

(58) Field of Classification Search
CPC ............ C23C 16/0227; C23C 16/4404; C23C 16/4405; C23C 16/45551; H01L 21/02046; H01L 21/02263; H01L 21/324; H01L 21/67103; H01L 21/67248; H01L 21/68771

See application file for complete search history.

(56) References Cited

U.S. PATENT DOCUMENTS

| | | | | | |
|---|---|---|---|---|---|
| 5,356,478 | A | * | 10/1994 | Chen ................. | H01L 21/67028 134/1 |
| 5,849,092 | A | * | 12/1998 | Xi ....................... | C23C 16/4405 134/1.1 |
| 6,042,654 | A | * | 3/2000 | Comita ............... | C23C 16/4405 134/21 |
| 6,569,257 | B1 | * | 5/2003 | Nguyen ............. | H01J 37/32862 134/1.1 |
| 6,626,185 | B2 | * | 9/2003 | Demos ............... | H01J 37/32862 134/1.1 |
| 2001/0040144 | A1 | * | 11/2001 | Marsh ................ | C23C 16/4481 134/1.1 |
| 2007/0128876 | A1 | * | 6/2007 | Fukiage ............. | H01J 37/32357 257/E21.226 |
| 2008/0282976 | A1 | * | 11/2008 | Okada ................ | C23C 16/4405 438/778 |

(Continued)

FOREIGN PATENT DOCUMENTS

JP 2018-170307 11/2018

*Primary Examiner* — Duy Vu N Deo
*Assistant Examiner* — Christopher Remavege
(74) *Attorney, Agent, or Firm* — IPUSA, PLLC

(57) ABSTRACT

A plasma purge method that is performed after dry cleaning in a process container and before applying a deposition process to a substrate includes: (a) activating and supplying a first process gas containing $Cl_2$ in the process container; and (b) activating and supplying a second process gas containing $H_2$ and $O_2$ in the process container.

8 Claims, 9 Drawing Sheets

(56) References Cited

U.S. PATENT DOCUMENTS

| | | | | |
|---|---|---|---|---|
| 2008/0295867 | A1* | 12/2008 | Poh | F04D 29/701 |
| | | | | 134/19 |
| 2011/0059600 | A1* | 3/2011 | Sakai | H01L 21/67028 |
| | | | | 438/584 |
| 2011/0318937 | A1* | 12/2011 | Akae | H01L 21/0228 |
| | | | | 118/724 |
| 2018/0282862 | A1* | 10/2018 | Umehara | H01L 21/68771 |

* cited by examiner

FIG.7

| BASIC REACTION | CHAIN REACTION | RECOMBINATION | $HO_2$ REACTION |
|---|---|---|---|
| $H_2+O_2=HO_2+H$ | $H+O_2=OH+O$<br>$O+H_2=OH+H$<br>$OH+H_2=H_2O+H$ | $H+H+M=H_2+M$<br>$O+O+M=O_2+M$<br>$H+OH+M=H_2O+M$<br>$O+H_2+M=HO_2+M$<br>$OH+OH+M=H_2O_2+M$ | $HO_2+HO_2=H_2O_2+O_2$<br>$H+HO_2=OH+OH, H_2+O_2$<br>$O+HO_2=OH+O_2$<br>$OH+HO_2=H_2O+O_2$<br>$H+H_2O_2=H_2+HO_2, OH+H_2O$<br>$O+H_2O_2=OH+HO_2$ |

PLASMA PURGE METHOD

CROSS-REFERENCE TO RELATED APPLICATION

The present application is based upon and claims priority to Japanese Patent Application No. 2020-155806, filed on Sep. 16, 2020, the entire contents of which are incorporated herein by reference.

BACKGROUND

1. Field

The present disclosure relates to a plasma purge method.

2. Background Art

A technique is known for preventing metal contamination generated at the time of cleaning of a deposition apparatus by supplying hydrogen radicals and oxygen radicals to a process container after dry cleaning of the process container and then coating the process container (see, for example, Patent Document 1).

PRIOR ART DOCUMENT

Patent Document

[Patent Document 1] Japanese Laid-open Patent Publication No. 2018-170307

The present disclosure provides a technique that enables to reduce metal contamination generated at the time of cleaning of a deposition apparatus.

SUMMARY

According to one aspect of the present disclosure, a plasma purge method is performed after dry cleaning in a process container and before applying a deposition process to a substrate, the plasma purge method including: (a) activating and supplying a first process gas containing $Cl_2$ in the process container; and (b) activating and supplying a second process gas containing $H_2$ and $O_2$ in the process container.

According to the present disclosure, it is possible to reduce metal contamination generated at the time of cleaning of a deposition apparatus.

BRIEF DESCRIPTION OF THE DRAWINGS

FIG. 7 is a diagram illustrating a combustion reaction of hydrogen;

DESCRIPTION OF THE EMBODIMENTS

Figure 1:
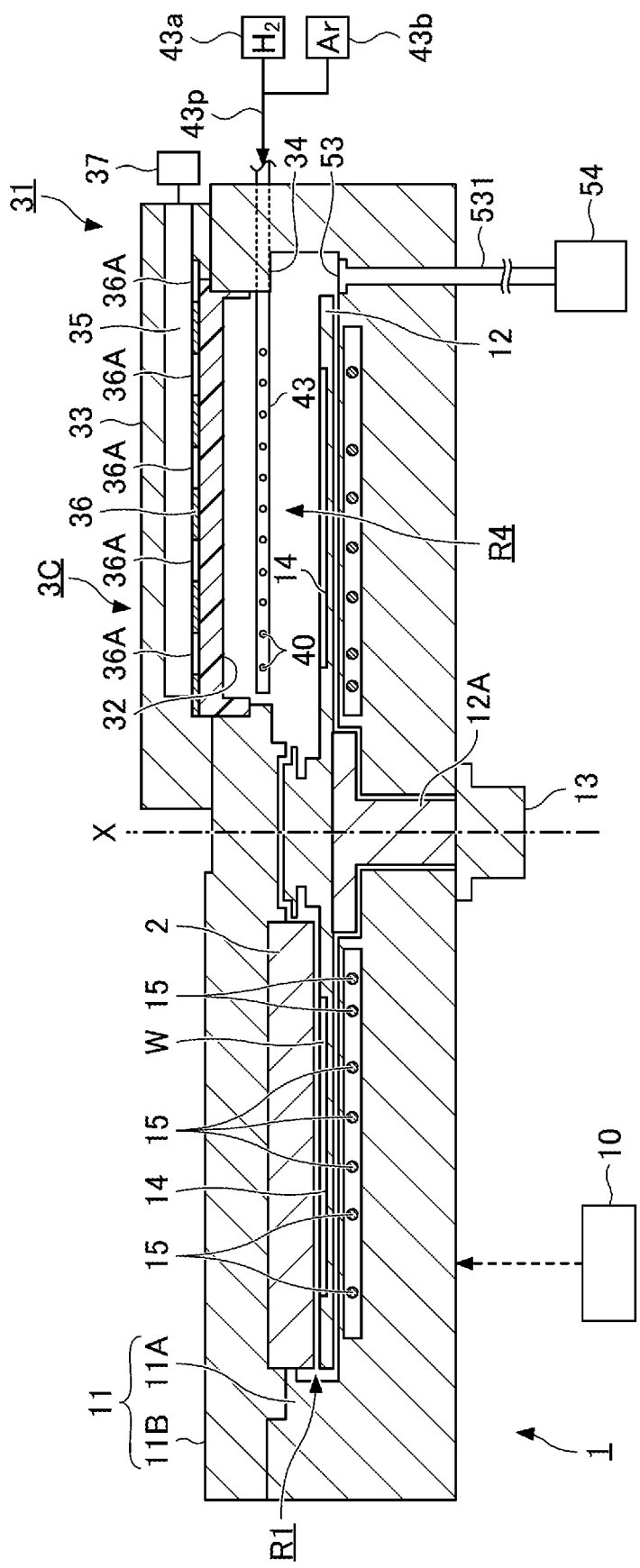
FIG. 1 a schematic longitudinal cross-sectional view illustrating an example of a deposition apparatus that conducts a plasma purge method according to an embodiment.

In the following, a non-limiting exemplary embodiment of the present disclosure will be described with reference to the drawings. In every drawing, the same or corresponding members or parts are designated by the same or corresponding reference numerals, and duplicate description is omitted as appropriate.

[Deposition Apparatus]

Figure 3:
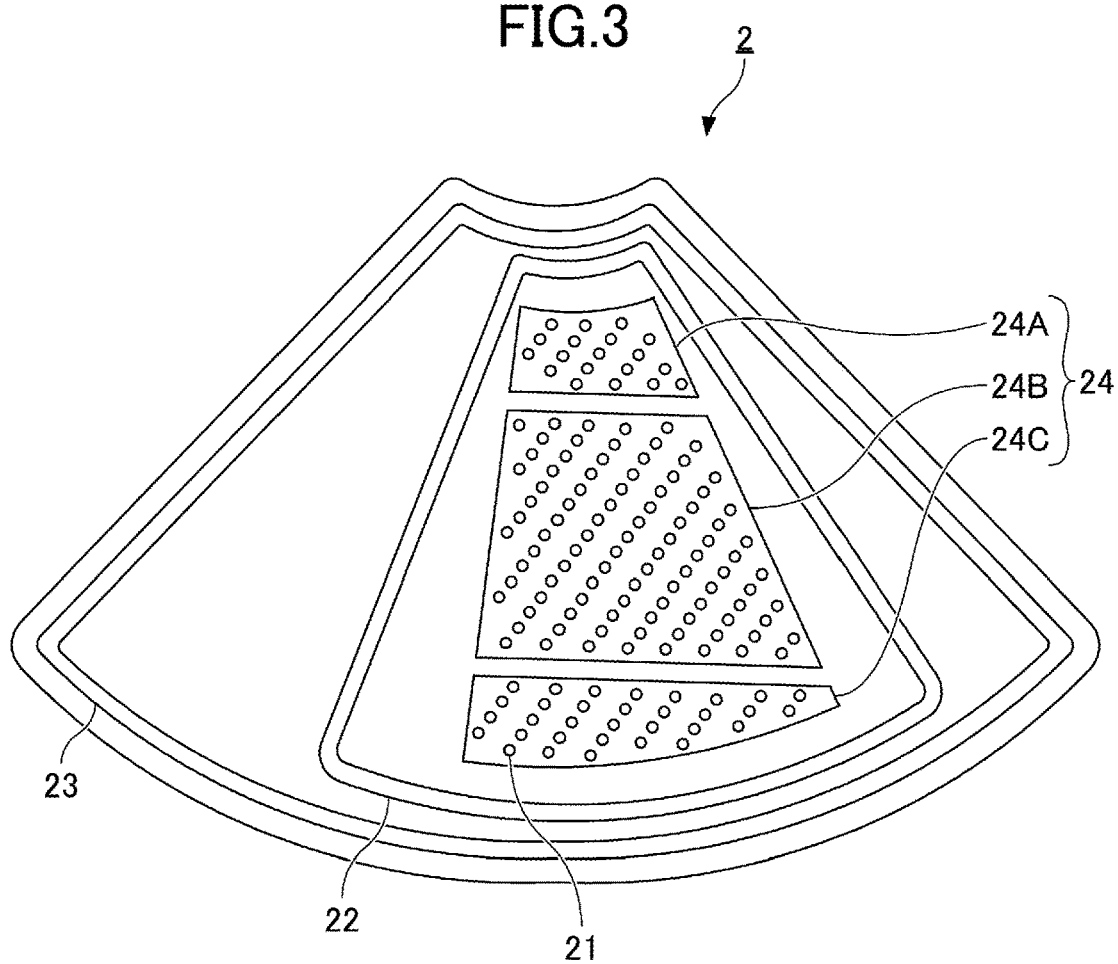
FIG. 3 is a bottom view of a gas supply and exhaust unit provided on the deposition apparatus of FIG. 1.

With reference to FIG. 1 and FIG. 3, an example of a deposition apparatus 1 for performing a plasma purge method according to an embodiment will be described. The deposition apparatus 1 is an apparatus that forms a silicon oxide ($SiO_2$) film on a surface of a substrate by an atomic layer deposition (ALD) process or a molecular layer deposition (MLD) process. The substrate may be, for example, a semiconductor wafer (hereinafter referred to as "wafer W"). A depression pattern such as trenches or vias may be formed on the surface of the wafer W, for example.

The deposition apparatus 1 includes a vacuum container 11 as a process container. The vacuum container 11 has a generally circular planar shape. The vacuum container 11 includes a container body 11A and a top plate 11B. The container body 11A constitutes a sidewall and a bottom. The top plate 11B is attached to the container body 11A via a sealing member, such as an O-ring, so as to seal the vacuum container 11 airtightly. The container body 11A and the top plate 11B can be made of, for example, aluminum (Al).

A rotation table 12 is provided within the vacuum container 11. The rotation table 12 has a circular shape. The rotation table 12 may be made, for example, of quartz. The rotation table 12 is provided horizontally with the center of the back surface supported by a support 12A. A rotation mechanism 13 is connected to the lower surface of the support 12A. The rotation mechanism 13 rotates the rotation table 12 around the axis X in the circumferential direction of the rotation table 12 in a clockwise direction in a plan view via the support 12A at the time of the deposition process.

Six circular recesses 14 are provided on the upper surface of the rotation table 12 along the circumferential direction (rotational direction) of the rotation table 12. The wafers W are placed on the respective recesses 14. That is, each wafer W is mounted on the rotation table 12 so as to revolve by the rotation of the rotation table 12.

A plurality of heaters 15 are provided at the bottom of the vacuum container 11. The plurality of heaters 15 may be arranged, for example, concentrically. The plurality of heaters 15 heat the wafers W placed on the rotation table 12.

A transport port 16 is formed on the side wall of the vacuum container 11. The transport port 16 is an opening for delivering the wafers W. The transport port 16 is configured to be openable and closeable airtightly by a gate valve (not illustrated). A transport arm (not illustrated) is provided outside the vacuum container 11, and the wafers W are transported by the transport arm into the vacuum container 11.

On the rotation table 12, a gas supply and exhaust unit 2, a second process area R2, a third process area R3, and a fourth process area R4 are provided toward the downstream side in the rotation direction of the rotation table 12 in this order along the rotation direction.

The gas supply and exhaust unit 2 includes a gas discharge port and an exhaust port for supplying silicon (Si)-containing gas. Hereinafter, the gas supply and exhaust unit 2 will be described also with reference to FIG. 3. The gas supply and exhaust unit 2 is formed in a fan shape that expands in the circumferential direction of the rotation table 12 from the central side toward the peripheral side of the rotation table 12 in a plan view. The lower surface of the gas supply and exhaust unit 2 is close to and faces the upper surface of the rotation table 12.

Gas discharge ports 21, an exhaust port 22, and a purge gas discharge port 23 are opened on the lower surface of the gas supply and exhaust unit 2. The gas discharge ports 21 are arranged in a plurality of lines in a fan-shaped area 24 inside the periphery of the lower surface of the gas supply and exhaust unit 2. At the time of the deposition process, the gas discharge ports 21 discharge the Si-containing gas like a shower downward during rotation of the rotation table 12 and supplies the gas to the entire surface of the wafer W. The silicon-containing gas may be, for example, a DCS [dichlorosilane] gas.

In the fan-shaped area 24, three areas 24A, 24B, and 24C are set from the central side of the rotation table 12 toward the peripheral side of the rotation table 12. The gas supply and exhaust unit 2 is provided with gas flow paths (not illustrated) partitioned from each other so that the Si-containing gas can be independently supplied to each of the gas discharge ports 21 provided in the respective areas 24A, 24B, and 24C. The respective upstream sides of the gas flow paths partitioned from each other are each connected to a Si-containing gas supply source (not illustrated) via a pipe equipped with a gas supply device including a valve and a mass flow controller.

The exhaust port 22 and the purge gas discharge port 23 are circumferentially opened on the periphery of the lower surface of the gas supply and exhaust unit 2 so as to surround the fan-shaped area 24 and face the upper surface of the rotation table 12. The purge gas discharge port 23 is located outside the exhaust port 22. The area inside the exhaust port 22 on the rotation table 12 constitutes a first process area R1 where the Si-containing gas is adsorbed on the surface of the wafer W. An exhaust device (not illustrated) is connected to the exhaust port 22, and a supply source of purge gas is connected to the purge gas discharge port 23. The purge gas may be, for example, argon (Ar) gas.

At the time of the deposition process, discharge of the Si-containing gas from the gas discharge port 21, exhaust from the exhaust port 22, and discharge of the purge gas from the purge gas discharge port 23 are performed. Thereby, the Si-containing gas and the purge gas discharged toward the rotation table 12 are directed toward the exhaust port 22 through the upper surface of the rotation table 12 and are exhausted from the exhaust port 22. In this way, by discharging and exhausting the purge gas, the atmosphere of the first process area R1 can be separated from the outside atmosphere, and the Si-containing gas can be limitedly supplied to the first process area R1. That is, it is possible to suppress the mixing of the Si-containing gas supplied to the first process area R1 with respective gasses supplied by plasma forming units 3A to 3C, which will be described later below, to the exterior of the first process area R1 and active species of the gases.

The second to fourth process areas R2 to R4 are provided with plasma forming units 3A to 3C for activating gases supplied to the respective areas. Each of the plasma forming units 3A to 3C is similarly configured. In the following, the plasma forming unit 3C illustrated in FIG. 1 will be described as a representative.

The plasma forming unit 3C supplies gas for plasma formation onto the rotation table 12 and supplies a microwave to the gas for plasma formation to generate plasma on the rotation table 12. The plasma forming unit 3C includes an antenna 31 for supplying the microwave.

The antenna 31 includes a dielectric plate 32 and a metal waveguide 33. The dielectric plate 32 is formed in a substantially fan shape that expands from the central side to the peripheral side of the rotation table 12 in a plan view. The top plate 11B of the vacuum container 11 is provided with a through hole having a generally fan shape corresponding to the shape of the dielectric plate 32, and the inner peripheral surface at the lower end of the through hole extends slightly toward the center of the through hole to form a support 34. The dielectric plate 32 is provided to close the through hole from the upper side and face the rotation table 12, and the periphery of the dielectric plate 32 is supported by the support 34. The waveguide 33 is provided on the dielectric plate 32. The waveguide 33 includes an interior space 35 extending over the top plate 11B. A slot plate 36 is provided on the upper surface of the dielectric plate 32 to be in contact with the dielectric plate 32. The slot plate 36 constitutes the lower section of the waveguide 33. The slot plate 36 has a plurality of slot holes 36A. The end toward the center of the rotation table 12 of the waveguide 33 is closed and a microwave generator 37 is connected to the end toward the periphery of the rotation table 12. For example, the microwave generator 37 supplies a microwave of 2.45 GHz to the waveguide 33.

A gas injector 41 is provided at the downstream side end of the second process area R2. The gas injector 41 is connected to a hydrogen ($H_2$) gas supply source 41a and an Argon (Ar) gas supply source 41b via a pipe 41p. The gas injector 41 discharges a $H_2$ gas and an Ar gas toward the upstream side. By supplying $H_2$, H is bonded to unbonded hands in the $SiO_2$ film, and the film can be modified into a dense film.

A gas injector 42 is provided at the upstream side end of the third process area R3. The gas injector 42 is connected to a $H_2$ gas supply source 42a and an Argon (Ar) gas supply source 42b via a pipe 42p. The gas injector 42 discharges a $H_2$ gas and an Argon (Ar) gas toward the downstream side. By supplying $H_2$, H is bonded to unbonded hands in the $SiO_2$ film, and the film can be modified into a dense film.

A gas injector 43 is provided at the downstream side end of the fourth process area R4. The gas injector 43 is connected to a hydrogen ($H_2$) gas supply source 43a and an Argon (Ar) gas supply source 43b via a pipe 43p. The gas injector 43 discharges a $H_2$ gas and an Argon (Ar) gas toward the upstream side. By supplying $H_2$, H is bonded to unbonded hands in the $SiO_2$ film, and the film can be modified into a dense film.

Figure 2:
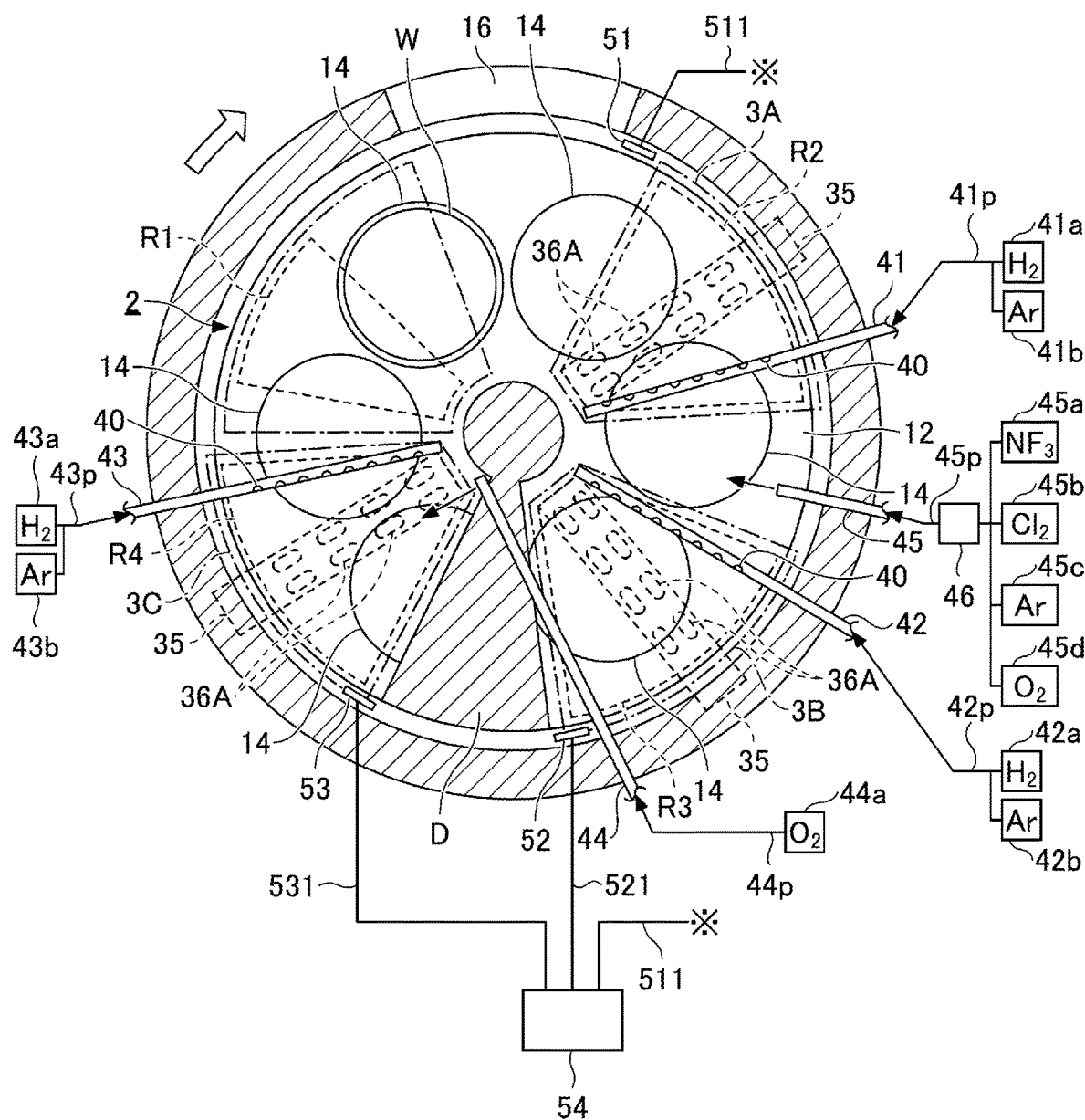
FIG. 2 is a schematic plan view of the deposition apparatus of FIG. 1.

The gas injectors 41 to 43 are composed of an elongated tubular body with the tip side closed, for example, as illustrated in FIGS. 1 and 2. The respective gas injectors 41 to 43 are provided on the respective sidewalls of the vacuum container 11 so as to extend horizontally from the sidewalls of the vacuum container 11 toward the central area, and are arranged to intersect the areas through which wafers W pass on the rotation table 12. Each of the gas injectors 41 to 43 is formed with gas discharge ports 40 along the length direction thereof. For example, the gas discharge ports 40 are formed on the gas injectors 41 to 43 in the areas covering the areas where the wafers W pass on the rotation table 12.

It should be noted that the gas injector 41 is provided below the plasma forming unit 3A in the example of FIG. 2, but may be provided below an area adjacent to the downstream side in the rotation direction of the plasma forming unit 3A, for example. The gas injector 42 is provided below the plasma forming unit 3B, but may be provided below an area adjacent to the upstream side in the rotation direction of the plasma forming unit 3B, for example. The gas injector 43 is provided below the plasma forming unit 3C, but may be provided below an area adjacent to the downstream side in the rotational direction of the plasma forming unit 3C, for example.

Also, a gas injector 44 is provided at the upstream side end of the fourth process area R4. The gas injector 44 is connected to an oxygen ($O_2$) gas supply source 44a via a pipe 44p. The gas injector 44 is composed of an elongated tubular body with the tip side closed. The gas injector 44 is provided on the side wall of the vacuum container 11 so as to extend horizontally from the side wall of the vacuum container 11 toward the central area and is arranged to intersect the area where the wafers W pass on the rotation table 12. A gas discharge hole (not illustrated) is provided at the tip side of the gas injector 44. The gas discharge hole discharges an $O_2$ gas from the central area of the vacuum container 11 toward the sidewall. The gas injector 44 may further be connected to another gas supply source, such as an Ar gas supply source.

In the second to fourth process areas R2 to R4, a microwave supplied to the waveguide 33 passes through the slot holes 36A in the slot plate 36 to the dielectric plate 32 and is supplied to gases discharged below the dielectric plate 32, such as $H_2$ gas and $O_2$ gas. Thereby, plasma is formed limitedly in the second to fourth process areas R2 to R4 below the dielectric plate 32.

A gas injector 45 is provided between the second process area R2 and the third process area R3, as illustrated in FIG. 2. The gas injector 45 is composed of an elongated tubular body with the tip side opened. The gas injector 45 is provided on the side wall of the vacuum container 11 so as to extend horizontally from the side wall of the vacuum container 11 toward the central area. The gas injector 45 discharges a variety of gases from the opening on the tip side toward the center of the vacuum container 11.

The gas injector 45 is connected to a nitrogen trifluoride ($NF_3$) gas supply source 45a, a chlorine $Cl_2$ gas supply source 45b, an Ar gas supply source 45c, and an $O_2$ gas supply source 45d via a pipe 45p. The pipe 45p is provided with a remote plasma source 46. The remote plasma source 46 activates various gases introduced from the respective supply sources via the pipe 45p into the gas injector 45. Thus, the gas injector 45 discharges various activated gases into the vacuum container 11.

For example, at the time of performing the deposition process, the gas injector 45 discharges the $O_2$ gas into the vacuum container 11. At this time, the gas injector 45 may activate the $O_2$ gas and discharge the activated $O_2$ gas into the vacuum container 11, or the gas injector 45 may discharge the $O_2$ gas into the vacuum container 11 without activating the $O_2$ gas.

Also, for example, at the time of performing dry cleaning in the vacuum container 11, the gas injector 45 discharges a fluorine-containing gas, such as $NF_3$ gas, into the vacuum container 11. At this time, the gas injector 45 may activate the $NF_3$ gas and discharge the activated $NF_3$ gas into the vacuum container 11, or the gas injector 45 may discharge the $NF_3$ gas into the vacuum container 11 without activating the $NF_3$ gas. Dry cleaning is performed in a case in which the deposition process is continued and a large amount of oxide films is deposited on the surface of the rotation table 12 or in the vacuum container 11, and it is determined that it is better to remove these oxides.

The gas injector 45 discharges $Cl_2$ gas and Ar gas into the vacuum container 11. At this time, the gas injector 45 may activate the $Cl_2$ gas and the Ar gas and discharge them into the vacuum container 11, or may discharge the $Cl_2$ gas and the Ar gas into the vacuum container 11 without activating the $Cl_2$ gas and the Ar gas.

It should be noted that details of the deposition process, dry cleaning, and plasma purge will be described later.

A separation area D is provided between the third process area R3 and the fourth process area R4 as illustrated in FIG. 2. The ceiling surface of the separation area D is set to be lower than the respective ceiling surfaces of the third and fourth process areas R3 and R4. The separation area D is formed in a fan shape that expands in the circumferential direction of the rotation table 12 from the central side toward the peripheral side of the rotation table 12 in a plan view, and the lower surface thereof is close to and faces the upper surface of the rotation table 12. The distance between the lower surface of the separation area D and the upper surface of the rotation table 12 may be set to, for example, 3 mm to prevent gas from penetrating below the separation area D. It should be noted that the lower surface of the separation area D may be set to the same height as the lower surface of the top plate 11B.

In addition, outside the rotation table 12, a first exhaust port 51, a second exhaust port 52, and a third exhaust port 53 are opened at respective positions corresponding to an upstream side end of the second process area R2, an upstream side end of the third process area R3, and a downstream side end of the fourth process area R4, respectively. The first to third exhaust ports 51 to 53 exhaust gases in the respective second to fourth process areas R2 to R4.

As illustrated in FIG. 1, the third exhaust port 53 is formed to be opened upwardly at the outside area of the rotation table 12 in the container body 11A of the vacuum container 11. The opening of the third exhaust port 53 is positioned below the rotation table 12. The third exhaust port 53 is connected to an exhaust device 54 via an exhaust flow path 531. The first and second exhaust ports 51 and 52 are also configured similarly to the third exhaust port 53 and are connected, for example, to the common exhaust device 54 via exhaust flow paths 511 and 521. The respective exhaust flow paths 511, 521, and 531 are provided with respective exhaust volume adjustors (not illustrated) so that the exhaust volumes from the first to third exhaust ports 51 to 53 by the exhaust device 54 are individually adjustable, for example. It should be noted that the exhaust volumes from the first to third exhaust ports 51 to 53 may be adjusted by a common exhaust volume adjuster. In this manner, in the second to fourth process areas R2 to R4, the respective gases discharged from the gas injectors 41 to 43 are exhausted from the first to third exhaust ports 51 to 53, and a vacuum atmosphere with a pressure corresponding to these exhaust volumes is formed in the vacuum container 11.

As illustrated in FIG. 1, the deposition apparatus 1 is provided with a controller 10 made of a computer. A program is stored in the controller 10. For the program, a group of steps is installed so that a control signal is transmitted to each section of the deposition apparatus 1 to control the operation of each section, and the plasma purge method, which will be described later below, is executed. Specifically, the rotation speed of the rotation table 12 by the rotation mechanism 13, the flow rate and the supply/stop of gas by each gas supply device, the exhaust volume by the exhaust device 54, the supply/stop of the microwave to the antenna 31 from the microwave generator 37, the power supply to the heaters 15, and the like are controlled by the program. The control of the power supply to the heaters 15 is the control of the temperature of the wafers W, and the control of the exhaust volume by the exhaust device 54 is the control of the pressure in the vacuum container 11. The program is installed in the controller 10 from a storage medium such as a hard disk, a compact disk, a magneto-optical disk, or a memory card.

<Plasma Purge Method>

Figure 4:
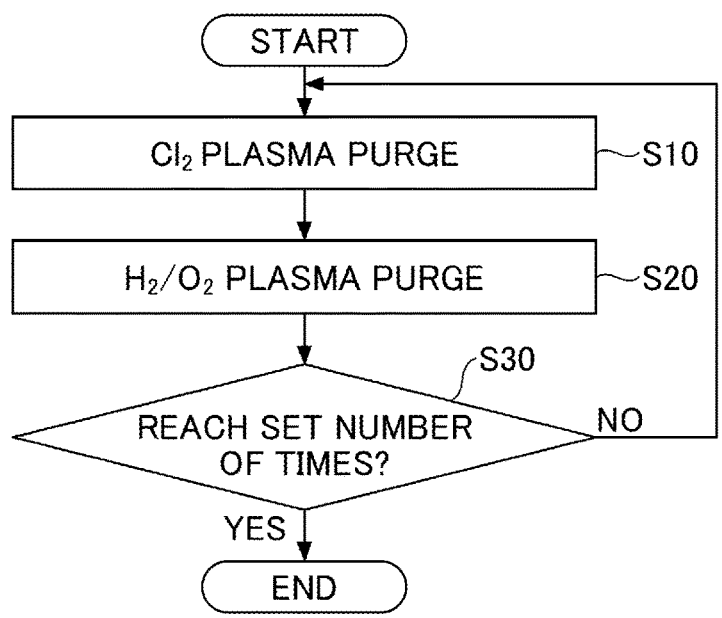
FIG. 4 is a diagram illustrating an example of a plasma purge method according to the embodiment.
Figure 5:
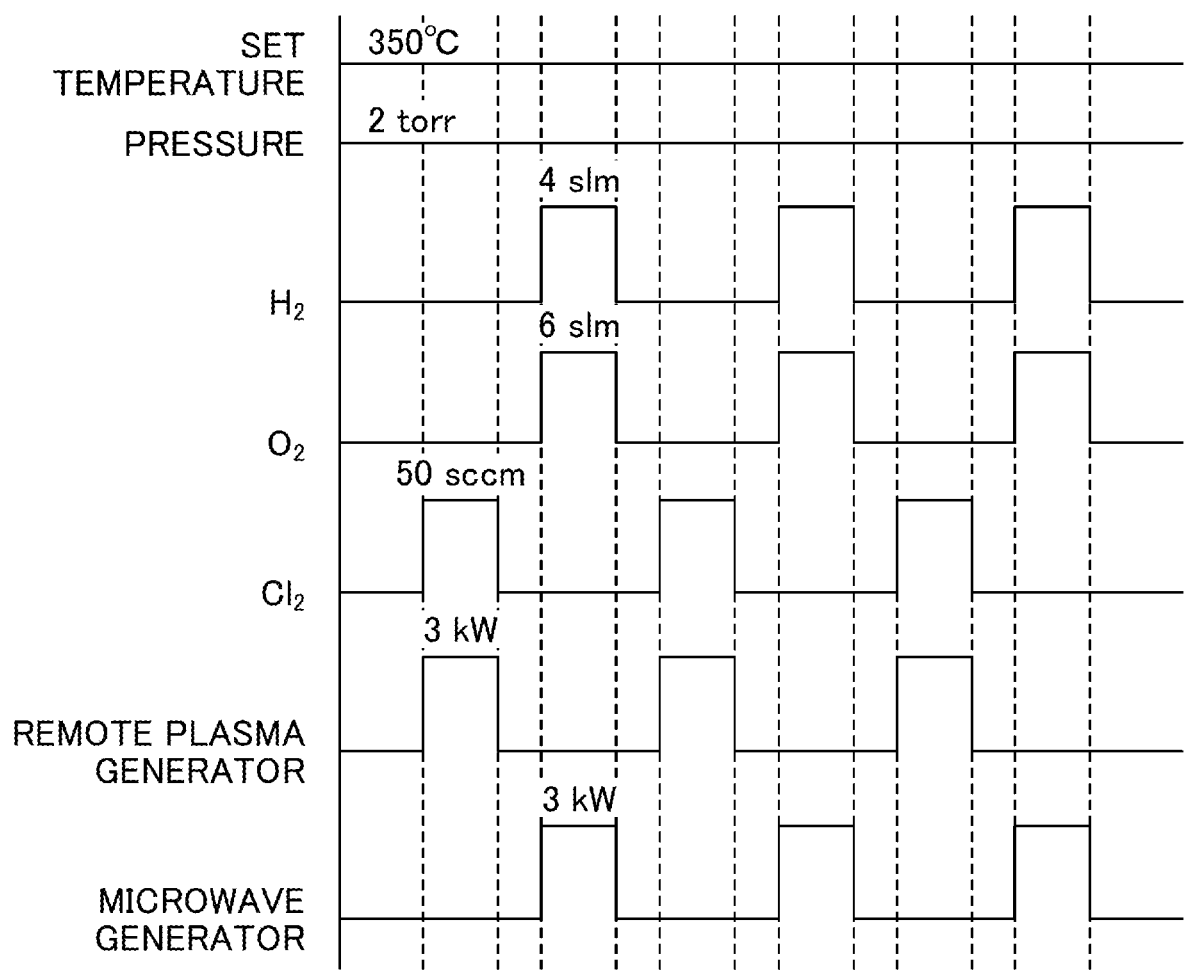
FIG. 5 is a diagram illustrating an example of a gas supply sequence of the plasma purge method according to the embodiment.
Figure 6:
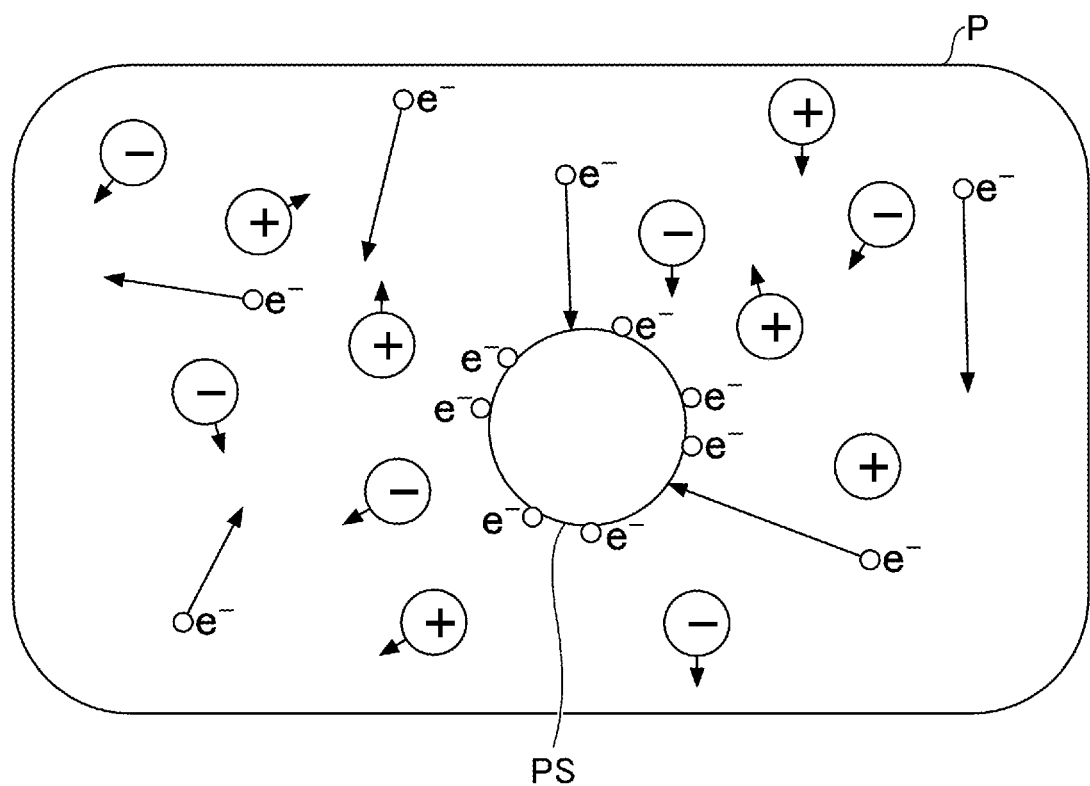
FIG. 6 is a diagram for describing a mechanism by which particles are reduced.

Referring to FIG. 4 to FIG. 6, an example of a plasma purge method according to an embodiment will be described. The plasma purge method according to the embodiment is performed after dry cleaning in the vacuum container 11 and before a deposition process is applied to wafers W. Thus, the plasma purge method of the embodiment is performed in a state in which wafers W are not mounted on the surface of the rotation table 12.

The plasma purge method of the embodiment is a method of reducing metal contamination that is generated at the time of dry cleaning in the vacuum container 11, by repeating a $Cl_2$ plasma purge step S10 and a $H_2/O_2$ plasma purge step S20 in this order up to reaching a set number of times. The set number of times may be one or more, for example.

In the $Cl_2$ plasma purge step S10, a $Cl_2$-containing gas is activated and supplied in the vacuum container 11. In the present embodiment, the $Cl_2$ gas and Ar gas are introduced into the pipe 45p from the $Cl_2$ gas supply source 45b and the Ar gas supply source 45c, respectively, and the output of the remote plasma source 46 is set to ON. Thereby, the $Cl_2$ gas and the Ar gas are activated by plasma in the pipe 45p, and the activated $Cl_2$ gas and Ar gas are supplied into the vacuum container 11 via the gas injector 45. It should be noted that the temperature of the heaters 15 may be set to, for example, 350° C. The pressure in the vacuum container 11 may be set to, for example, 2 Torr (267 Pa). The flow rate of the $Cl_2$ gas may be set to, for example, 50 sccm. The output of the remote plasma source 46 may be set to, for example, 3 kW. Also, an Ar gas may be supplied from the gas injectors 41 to 43 into the vacuum container 11.

Incidentally, at the time of dry cleaning in the vacuum container 11, a fluorine-containing gas supplied into the vacuum container 11 has an etching function and can remove an oxide film. However, at the same time, the fluorine-containing gas may also cause some damage to the rotation table 12 made of quartz, the container body 11A and the top plate 11B made of aluminum, other parts in the vacuum container 11, and the like. This may cause metal particles to be drawn out, metal contamination to occur, and may adversely affect the deposition process after dry cleaning. For example, when Al, which is a material of the container body 11A and the top plate 11B, reacts with a fluorine-containing gas, a fluorine compound such as aluminum fluoride ($AlF_3$) is generated and adheres as particles on the wafer W in the deposition process after dry cleaning.

In the $Cl_2$ plasma purge step S10, the activated $Cl_2$ gas and the activated Ar gas are introduced from the gas injector 45 into the vacuum container 11 as described above. As a result, $AlF_3$ generated by dry cleaning is reduced by the $Cl_2$ gas to form ammonium chloride ($AlCl_3$). Because $AlCl_3$ has a higher vapor pressure than $AlF_3$ and sublimates at a lower temperature, it is easily discharged from the inside of the vacuum container 11. By performing the $Cl_2$ plasma purge step S10 in this way, it is possible to remove $AlF_3$ that causes particles at the time of the deposition process. In the $Cl_2$ plasma purge step S10, the set temperature of the heaters 15 is adjusted so that the temperature inside the vacuum container 11 enables $AlCl_3$ to sublimate. Such a set temperature of the heaters 15 may be, for example, 300° C. or more.

Also, as illustrated in FIG. 6, at the time of the deposition process or dry cleaning, the surface of a particle source PS is easily charged negatively (−) by electrons (e−) having high mobility in a bulk plasma P. Then, the negatively (−) charged particle source PS easily adheres to the rotation table 12 or the wafer that is positively (+) charged.

In the $Cl_2$ plasma purge step S10, the activated $Cl_2$ gas and the activated Ar gas are introduced from the gas injector 45 into the vacuum container 11 as described above. As a result, the charge of the particle source PS and the rotation table 12 is eliminated by the activated $Cl_2$ gas. Therefore, it is possible to suppress particles from adhering onto the wafer W in the deposition process after dry cleaning.

The $H_2/O_2$ plasma purge step S20 is performed after the $Cl_2$ plasma purge step S10. In the $H_2/O_2$ plasma purge step S20, hydrogen radicals and oxygen radicals are supplied in the vacuum container 11. In the present embodiment, the $H_2$ gas is supplied from the gas injectors 41 to 43 into the vacuum container 11 and the $O_2$ gas is supplied from the gas injectors 44 and 45 into the vacuum container 11. Also, the microwave is supplied from the plasma forming units 3A to 3C to the $H_2$ gas and the $O_2$ gas. Thereby, the $H_2$ gas and the $O_2$ gas are decomposed and activated by the microwave to become hydrogen radicals and oxygen radicals. It should be noted that the temperature of the heaters 15 may be set to, for example, 350° C. The pressure in the vacuum container 11 may be set to, for example, 2 Torr (267 Pa). The flow rate of the $H_2$ gas may be set to, for example, 4 slm. The flow rate of the $O_2$ gas may be set to, for example, 6 slm. The output of microwave generator 37 may be set to, for example, 3 kW. Also, an Ar gas may be supplied from the gas injectors 41 to 43 into the vacuum container 11.

FIG. 7 is a diagram illustrating a combustion reaction of hydrogen. In the process of reaction between $H_2$ and $O_2$, a variety of reactions occurs and a hydrogen radical H* is generated. Such a H* radical serves as a reductant. Moreover, an oxygen radical O* serves as an oxidant. By supplying such a reductant and an oxidant, a metal element can be extracted from parts in the vacuum container 11 by a reduction reaction or an oxidation reaction. In other words, not only metal particles present on the surfaces of the parts but also metal particles present slightly inside the surfaces and released from the parts can be extracted and removed by the reduction reaction or the oxidation reaction. Although such a reduction reaction and an oxidation reaction do not work effectively to all metal elements, because many kinds of metal element particles are present in the vacuum container 11, it is considered that a metal element to which the reduction reaction or the oxidation reaction effectively works is necessarily included. By supplying such a reductant and an oxidant, the supply of the reductant and the oxidant effectively work on effective metal elements and contributes to the suppression of metal contamination.

Upon repeating the $Cl_2$ plasma purge step S10 and the $H_2/O_2$ plasma purge step S20 in this order to reach the set number of times (step S30), the plasma purge method of the embodiment ends. It should be noted that the set number of times may be preferably 2 or more. In a case in which the set number of times is 2 or more, the time per $Cl_2$ plasma purge step S10 can be shortened. Therefore, the rotation table 12, the container body 11A, the top plate 11B, other parts in the vacuum container 11 and the like can be suppressed from being etched.

As described above, according to the plasma purge method of the embodiment, through two different types of plasma purge steps, namely the $Cl_2$ plasma purge step S10 and the $H_2/O_2$ plasma purge step S20, metal contamination can be greatly reduced. Specifically, through the $Cl_2$ plasma purge step S10, a fluorine compound such as $AlF_3$ generated by dry cleaning can be reduced and removed. In addition, through the $H_2/O_2$ plasma purge step S20, not only metal particles present on the surfaces of the parts in the vacuum container 11 but also metal particles that are free from the parts slightly inside the surfaces can also be pulled out and removed by a reduction reaction or an oxidation reaction.

[Entire Process]

Figure 8:
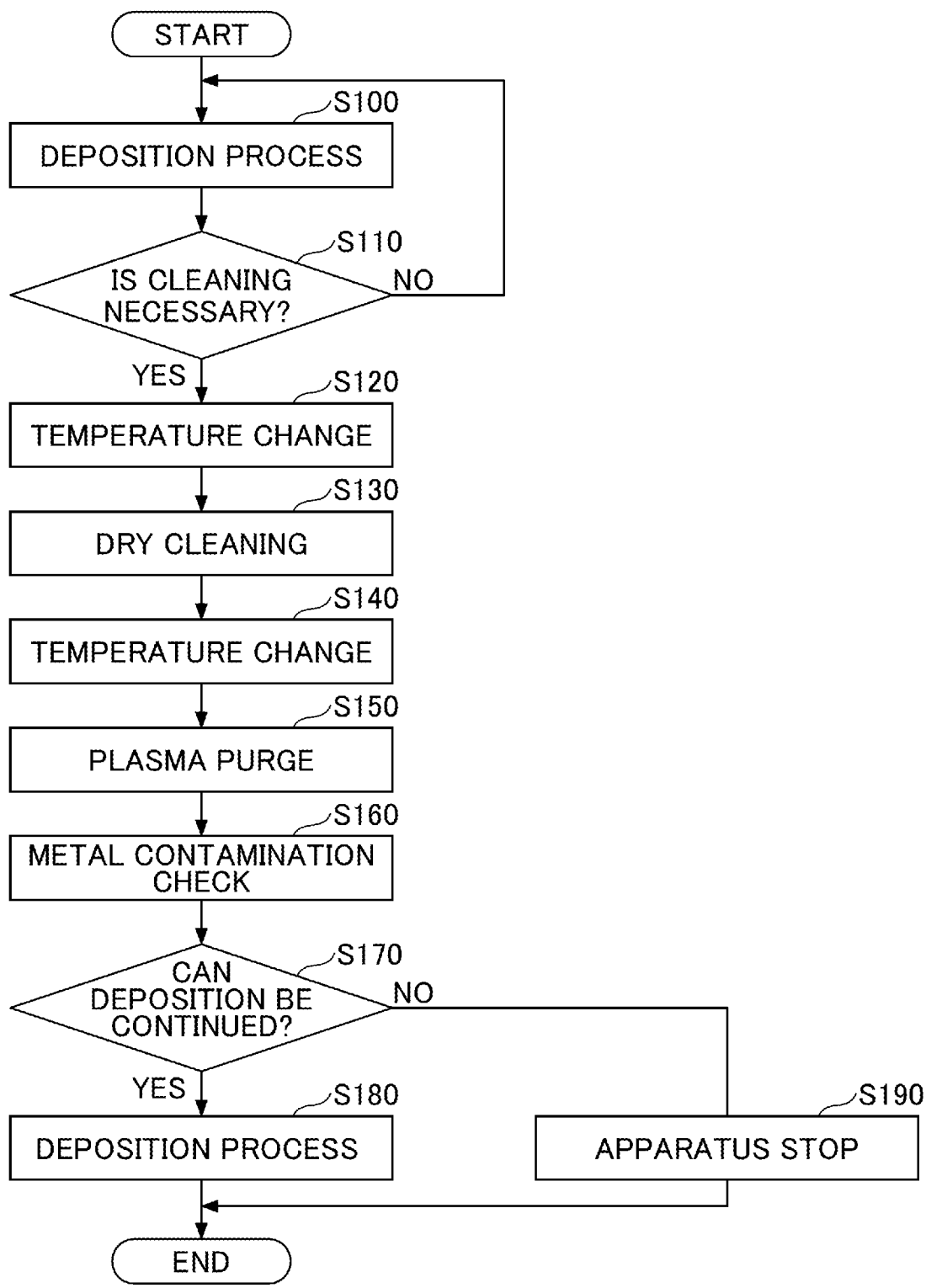
FIG. 8 is a flowchart for describing an entire series of processes of a deposition process and a cleaning process.

Referring to FIG. 8, an example of an entire series of processes conducted by the deposition apparatus 1 will be described. The entire series of processes includes a plasma purge method according to the embodiment.

In step S100, a deposition process for usual mass production is performed. In the following, an example of forming an oxide film will be described. As the deposition process is repeated, the oxide film is deposited on the surfaces of the rotation table 12, the inner wall of the vacuum container 11 and a variety of parts in the vacuum container 11, and the film thickness of the oxide film increases. In the present embodiment, the set temperature of the heaters 15 (hereinafter referred to as "deposition temperature") at the time of the deposition process may be, for example, 500° C. to 600° C.

In step S110, whether dry cleaning is necessary or not is determined. When the oxide film deposited on the vacuum container 11 is thickened by repeating the deposition process and the cleaning for removing the oxide film is determined to be necessary, the process advances to step S120. In contrast, when the cleaning for removing the oxide film is determined to be still unnecessary, the process returns to step S100, and the deposition process for mass production is continued.

In step S120, a first temperature changing step is performed to change to the temperature for performing dry cleaning. In the present embodiment, the set temperature of the heaters 15 at the time of the dry cleaning (hereinafter, referred to as "cleaning temperature") is a temperature lower than the deposition temperature and may be 100° C. to 200° C., for example.

In step S130, the dry cleaning in the vacuum container 11 is performed. In the dry cleaning, at a cleaning temperature, a fluorine-containing gas is supplied from the gas injector 45 into the vacuum container 11 and the deposited oxide is removed. At this time, the fluorine-containing gas causes some damage to the parts in the vacuum container 11, resulting in metal contamination. From the viewpoint of suppressing such damage, the cleaning temperature is set to be low within the range where dry cleaning is possible. Therefore, the cleaning temperature is often lower than the deposition temperature.

In step S140, a second temperature changing step is performed to change the temperature for performing the plasma purge described above. In the present embodiment, the set temperature of the heaters 15 at the time of the plasma purge (hereinafter referred to as "plasma purge temperature") is a temperature that is higher than the cleaning temperature, and may be, for example, 300° C. to 400° C.

In step S150, the plasma purge method described above is performed. That is, the $Cl_2$ plasma purge step S10 and the $H_2/O_2$ plasma purge step S20 are repeated in this order up to reaching the set number of times. This reduces metal contamination generated during at the time of the dry cleaning in the vacuum container 11.

In step S160, the metal contamination is checked. By using a predetermined metal contamination checking device, the degree of the metal contamination in the vacuum container 11 is checked.

In step S170, whether the deposition process should be continued or not is determined depending on the degree of the metal contamination. When it is determined that the deposition process should be continued, the process goes to step S180, the deposition process for mass production is continued, and the process ends. After that, the process is repeated from step S100.

In contrast, when it is determined that the deposition process should not be continued depending on the degree of the metal contamination, the process advances to step S190, the deposition apparatus is temporarily stopped, and the process ends. After that, the plasma purge method according to the embodiment is repeated again, or measures to search the cause and the like are performed. However, by adopting the plasma purge method according to the embodiment, a situation of not being able to continue the deposition process is considered to decrease dramatically. In this sense, step S190 can be said to be a supplemental step.

Thus, according to the plasma purge method of the embodiment, the metal contamination can be quickly and effectively suppressed, and the productivity of the deposition process can be enhanced.

Example

Figure 9:
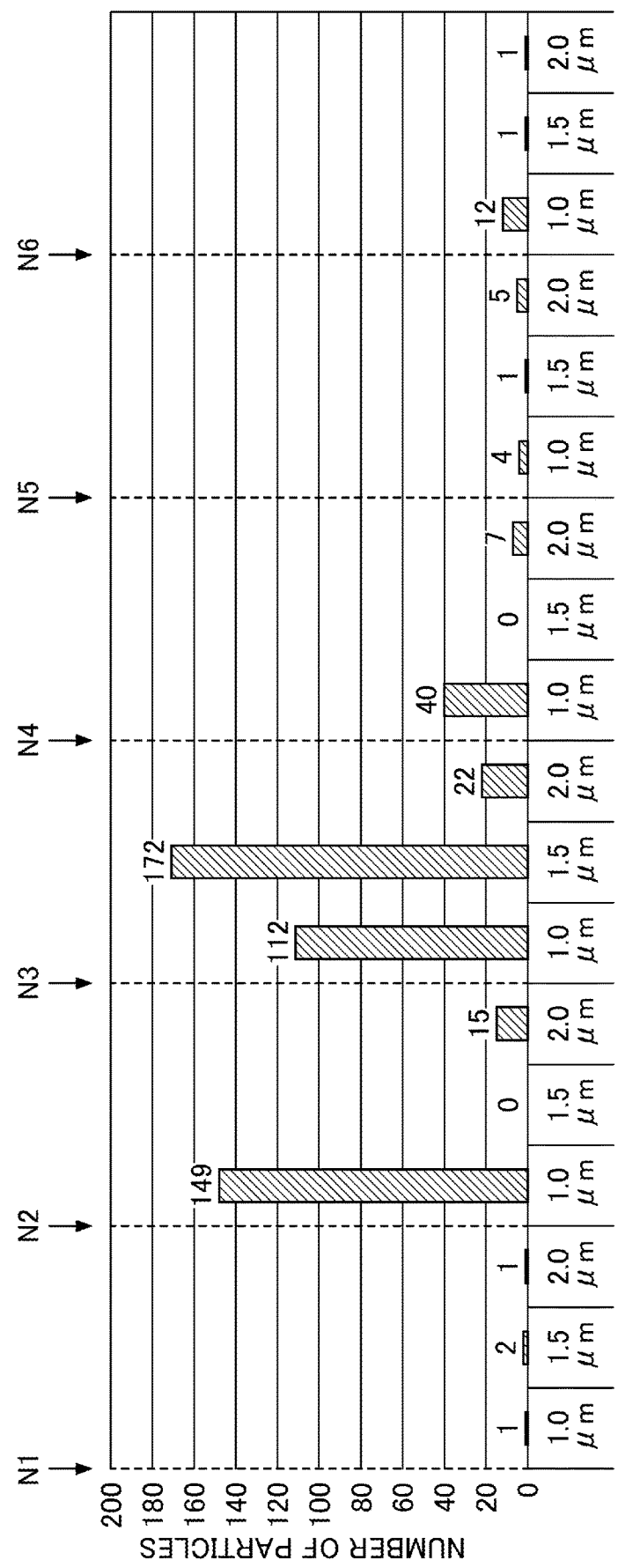
FIG. 9 is a diagram illustrating the results of Example carrying out the plasma purge method of the embodiment with Comparative Example.
Figure 10:
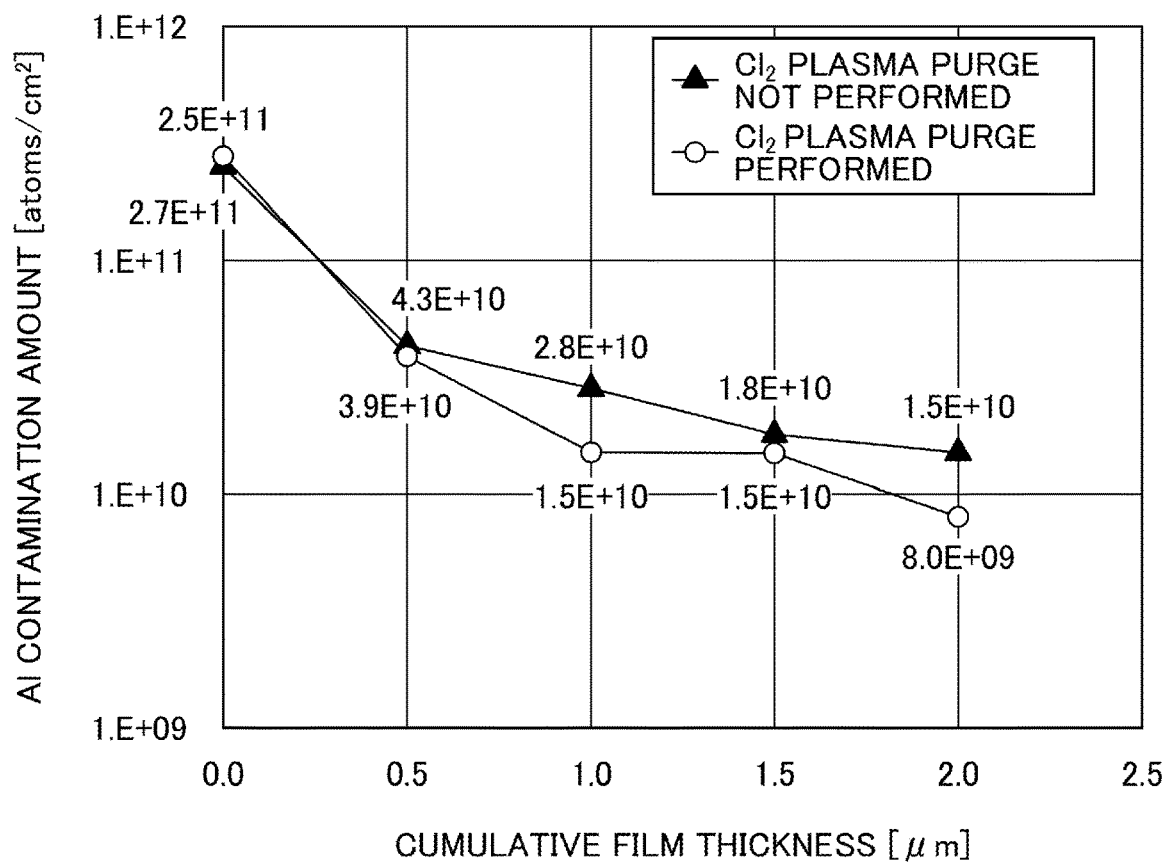
FIG. 10 is a diagram illustrating the results of Example carrying out the plasma purge method of the embodiment with Comparative Example.
Figure 11:
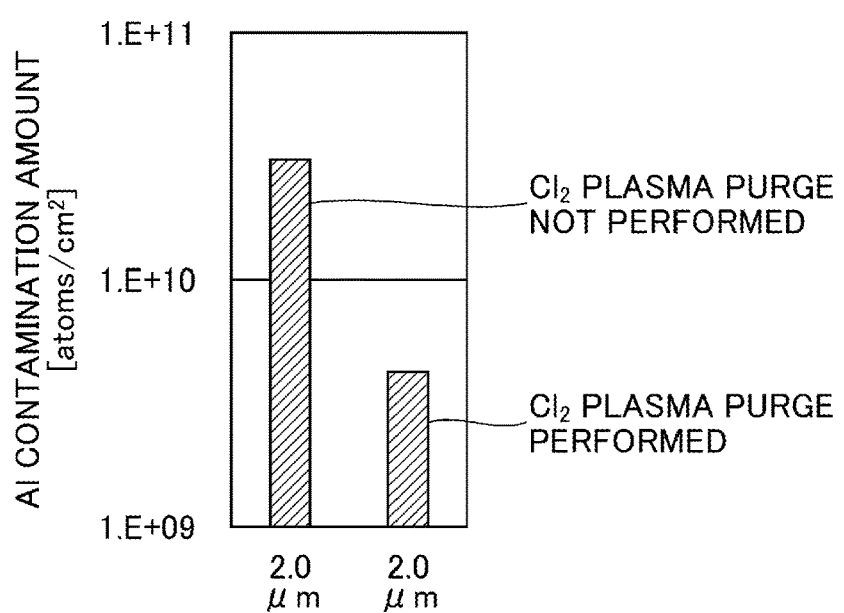
FIG. 11 a diagram illustrating the results of Example carrying out the plasma purge method of the embodiment with Comparative Example.

Referring to FIG. 9 to FIG. 11, Example carried out by using the deposition apparatus 1 described above will be described.

In Example 1, a cycle in which a recovery process in the vacuum container 11 and a deposition process for wafers were performed in this order was conducted six times. In the first to third cycles, as the recovery process, dry cleaning was performed and then the $H_2/O_2$ plasma purge step S20 was performed. In the fourth to sixth cycles, as the recovery process, dry cleaning was performed, and then the $Cl_2$ plasma purge step S10 and the $H_2/O_2$ plasma purge step S20 were performed. Also, in the first to sixth cycles, the deposition process was repeated on the wafer until the film thickness of the oxide film deposited in the vacuum container 11 (hereinafter, referred to as "the cumulative film thickness") reached 2.0 μm after the recovery process, and the number of particles adhering to the wafer surface was measured when the cumulative film thickness was 1.0 μm, 1.5 μm, and 2.0 μm. Also, the amount of aluminum (Al) contamination adhering to the wafer front surface and the wafer back surface was also measured.

The results of the particle measurement are illustrated in FIG. 9. In FIG. 9, the vertical axis indicates the number of particles having a particle size of 31 nm or greater. In FIG. 9, arrows N1 to N6 indicate the respective points of time when the first to sixth recovery processes were performed.

As illustrated in FIG. 9, for the deposition process after the first recovery process, the number of particles was 1, 2, and 1 when the cumulative film thickness was 1.0 μm, 1.5 μm, and 2.0 μm, respectively, and the number of particles was small. For the deposition process after the second recovery process, the number of particles was 149, 0, and 15 when the cumulative film thickness was 1.0 μm, 1.5 μm, and 2.0 μm, respectively, and the number of particles decreased after the cumulative film thickness reached 1.5 μm. Also, when the components of 149 particles were analyzed, 13% were particles containing Al. For the deposition process after the third recovery process, the number of particles was 112, 172, and 22 when the cumulative film thickness was 1.0 μm, 1.5 μm, and 2.0 μm, respectively, and the number of particles decreased after the cumulative film thickness reached 2.0 μm. Also, when the components of 112 particles were analyzed, 19% were particles containing Al.

In contrast, for the deposition process after the fourth recovery process, the number of particles was 40, 0, and 7 when the cumulative film thickness was 1.0 μm, 1.5 μm, and 2.0 μm, respectively, and the number of particles decreased at an early stage after the recovery process. For the deposition process after the fifth recovery process, the number of particles was 4, 1, and 5 when the cumulative film thickness was 1.0 μm, 1.5 μm, and 2.0 μm, respectively, and the number of particles decreased at an early stage after the recovery process. For the deposition process after the sixth recovery process, the number of particles was 12, 1, and 1 when the cumulative film thickness was 1.0 μm, 1.5 μm, and 2.0 μm, respectively, and the number of particles decreased at an early stage after the recovery process. Also, when the components of 12 particles were analyzed, 9% were particles containing Al, and the proportion of particles containing aluminum was reduced in comparison to that after the second and third recovery processes.

In this manner, as the recovery process, by performing the dry cleaning, and then performing the $Cl_2$ plasma purge step S10 and the $H_2/O_2$ plasma purge step S20, the generation of particles can be suppressed from an early stage after the recovery process, as illustrated in FIG. 9. In addition, it was found by analyzing the components of particles that metal contamination generated at the time of dry cleaning can be reduced.

The results of measuring the amount of Al contamination on the wafer surface are illustrated in FIG. 10. In FIG. 10, the triangular marks indicate the measurement results after performing, as the recovery process, dry cleaning and then performing only the $H_2/O_2$ plasma purge step S20. That is, the triangular marks indicate the measurement results when the $Cl_2$ plasma purge step S10 was not performed after the dry cleaning. Also, the circle marks indicate the measurement results after performing, as the recovery process, dry cleaning and then performing the $Cl_2$ plasma purge step S10 and the $H_2/O_2$ plasma purge step S20. That is, the circle marks indicate the measurement results when the $Cl_2$ plasma purge step S10 was performed after the dry cleaning. In FIG. 10, the horizontal axis indicates the cumulative film thickness [μm] and the vertical axis indicates the amount of Al contamination [atoms/cm$^2$] on the wafer surface.

As illustrated in FIG. 10, after the dry cleaning, by performing the $Cl_2$ plasma purge step S10 and the $H_2/O_2$ plasma purge step S20, the amount of Al contamination on the wafer surface was reduced relative to performing only the $H_2/O_2$ plasma purge step S20. This result suggests that the $Cl_2$ plasma purge step S10 is effective in reducing Al contamination.

The measurement results of the Al contamination amount on the back surface of the wafer is illustrated in FIG. 11. In FIG. 11, the bar graph on the left indicates the measurement result after performing only the $H_2/O_2$ plasma purge step S20 after the dry cleaning. That is, the bar graph on the left indicates the measurement result when the $Cl_2$ plasma purge step S10 was not performed after the dry cleaning. Also, the bar graph on the right indicates the measurement result after performing the $Cl_2$ plasma purge step S10 and the $H_2/O_2$ plasma purge step S20 after the dry cleaning. That is, the bar graph on the right indicates the measurement result when the $Cl_2$ plasma purge step S10 was performed after the dry cleaning. Both measurement results indicate the amount of Al contamination on the back surface of the wafer when the cumulative film thickness was 2.0 μm. In FIG. 11, the vertical axis indicates the amount of Al contamination [atoms/cm$^2$] on the back surface of the wafer.

As illustrated in FIG. 11, after the dry cleaning, by performing the $Cl_2$ plasma purge step S10 and the $H_2/O_2$ plasma purge step S20, the amount of Al contamination on the wafer back surface was reduced relative to performing only the $H_2/O_2$ plasma purge step S20. This result suggests that the $Cl_2$ plasma purge step S10 is effective in removing $AlF_3$ on the surface of the rotation table 12 generated by dry cleaning.

The embodiments disclosed herein should be considered to be exemplary in all respects and not restrictive. The above embodiments may be omitted, substituted, or modified in various forms without departing from the appended claims and spirit thereof.

In the embodiments described above, the deposition apparatus is a semi-batch type apparatus that revolves a plurality of wafers arranged on a rotation table in a vacuum container by the rotation table, that causes the wafers to pass through a plurality of areas in order and, that processes the wafers, but the present disclosure is not limited to this. For example, a processing apparatus may be a single-wafer type apparatus that processes wafers one by one.

What is claimed is:

1. A plasma purge method that is performed in a process container after dry cleaning in the process container and before applying a deposition process to a substrate, the plasma purge method comprising:
    (a) activating and supplying a first process gas containing $Cl_2$ in the process container, and
    (b) activating and supplying a second process gas containing $H_2$ and $O_2$ in the process container, said plasma purge method further comprising:
    changing a temperature of a heater provided in the process container from a first temperature for the dry cleaning to a second temperature for the steps (a) and (b), said second temperature being higher than the first temperature,
    wherein the dry cleaning, the changing the temperature, and the steps (a) and (b) are sequentially performed as different steps.

2. The plasma purge method according to claim 1, wherein (a) and (b) are repeated.

3. The plasma purge method according to claim 1,
    wherein the dry cleaning is performed by supplying a fluorine-containing gas in the process container, and
    wherein in (a), a fluorine compound generated by the dry cleaning is reduced.

4. The plasma purge method according to claim 3, wherein (a) is performed at a temperature that enables aluminum fluoride ($AlF_3$) to sublimate within a vacuum atmosphere.

5. The plasma purge method according to claim 1, wherein the first process gas and the second process gas are activated by plasma.

6. The plasma purge method according to claim 1, wherein the first process gas is activated by plasma outside the process container.

7. The plasma purge method according to claim 1, wherein the second process gas is activated by plasma inside the process container.

8. The plasma purge method according to claim 1, wherein the first temperature is from 100° C. to 200° C., and the second temperature is from 300° C. to 400° C.

* * * * *